United States Patent
Chen

(10) Patent No.: US 6,753,237 B1
(45) Date of Patent: Jun. 22, 2004

(54) METHOD OF SHALLOW TRENCH ISOLATION FILL-IN WITHOUT GENERATION OF VOID

(75) Inventor: Cheng-Shun Chen, Miaoli (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/424,657

(22) Filed: Apr. 28, 2003

(51) Int. Cl.[7] .............................................. H01L 21/76
(52) U.S. Cl. ........................ 438/424; 438/221; 438/296; 438/435; 438/745; 438/749
(58) Field of Search .................. 438/221, 294–296, 438/400, 404, 424, 435, 437, 745, 749, 750, 753, 756, 757, 697, 297

(56) References Cited

U.S. PATENT DOCUMENTS

| | | | | |
|---|---|---|---|---|
| 5,258,332 A | * | 11/1993 | Horioka et al. | 438/389 |
| 5,578,518 A | * | 11/1996 | Koike et al. | 438/424 |
| 5,712,185 A | * | 1/1998 | Tsai et al. | 438/424 |
| 5,837,612 A | * | 11/1998 | Ajuria et al. | 438/697 |
| 5,956,598 A | * | 9/1999 | Huang et al. | 438/424 |
| 6,391,493 B1 | * | 5/2002 | Goodenough et al. | 429/218.1 |
| 2003/0119256 A1 | * | 6/2003 | Dong et al. | 438/257 |

* cited by examiner

Primary Examiner—Amir Zarabian
Assistant Examiner—Khanh Duong
(74) Attorney, Agent, or Firm—Thomas, Kayden, Horstemeyer & Risley

(57) ABSTRACT

A method of shallow trench isolation fill-in to create the void-free trenches is disclosed. First, a liner oxide layer is formed in the trenches. Next, the silicon substrate is pre-wetted with DI water, and the liner oxide layer is etched by a chemical solution. The chemical solution is an oxide etchant, such as HF solution or BOE (buffered oxide etchant). The etching rate close to an opening of a trench is faster than a bottom of the trench. Finally, the trenches are filled with a HDP oxide layer.

17 Claims, 10 Drawing Sheets

METHOD OF SHALLOW TRENCH ISOLATION FILL-IN WITHOUT GENERATION OF VOID

BACKGROUND OF THE INVENTION

1. Field of the Invention

The invention relates in general to a method of shallow trench isolation fill-in, and more particularly to a method of shallow trenches isolation fill-in without generation of void.

2. Description of the Related Art

In the manufacturing process of semiconductor device, shallow trench isolation (STI) is a common technique used to prevent unwanted interactions between the circuit elements of semiconductor device. Since the advanced semiconductor technology increases the integration of the circuit elements and interconnection on a silicon substrate (or a wafer), the trench aspect ratio, typically defined as the trench height divided by the trench width, is increased. Therefore, it becomes more difficult to fill in the narrow trench with an insulating material, and the unwanted voids could be generated in the trench so that the insulating function of insulating material fails.

Currently, high density plasma (HDP) oxide deposition is used to fill the trenches, especially the trenches with high aspect ratio. FIG. 1A~FIG. 1F schematically illustrate a conventional trench formation and high density plasma (HDP) oxide fill-in process. As shown in FIG. 1A, a silicon substrate 100 is provided first, and then a silicon oxide layer 102 is deposited on the silicon substrate 100 followed by the deposition of a silicon nitride layer 104 on the silicon oxide layer 102. Next, a photo-resist (PR) layer is deposited on the silicon nitride layer 104, and etched according to a photo-mask with a predetermined pattern to form a photo-resist (PR)-patterned layer 106, as shown in FIG. 1B. Then, the silicon oxide layer 102 and the silicon nitride layer 104 are etched according to the PR-patterned layer 106, as shown in FIG. 1C. The PR-patterned layer 106 is removed after etching. Some of silicon loss may occur and create the recesses 108 on the silicon substrate 100.

Subsequently, the silicon substrate 100 is etched to form the trenches 110, as shown in FIG. 1D. A conventional plasma dry etching process, such as reactive ion etch (RIE), is used to carve the silicon substrate 100 to form the trenches 110. During the RIE process, the surfaces of the trenches 110 will be damaged by ion bombardment. These damages can be repaired by forming a liner oxide layer 112 on the interior surfaces of the trenches 110, as shown in FIG. 1E. The interior surfaces of the trenches 110 can be oxidized by thermal oxidation process to form the liner oxide layer 112. Then, high density plasma (HDP) oxide fill-in process is performed. After a high density plasma (HDP) oxide layer 114 is deposited, a void 116 could be created in the trench 110 due to sidewall re-deposition, as shown in FIG. 1F.

Generally, a thin liner oxide layer 112 is obtained according to the above mentioned method, and the thickness thereof is about a couple of hundred angstroms. However, in some of manufacturing processes, a thicker liner oxide layer is required to improve the electrical characteristics of semiconductor device.

Please refer to FIG. 2A~FIG. 2D, another conventional trench formation and high density plasma (HDP) oxide fill-in process. Before the step of FIG. 2A, steps similar to those of FIG. 1A~FIG. 1C are carried out. As shown in FIG. 2A, an oxide layer 202 is further deposited over the silicon substrate 100 after formation of PR-patterned layer 106 (FIG. 1C). Then, a plurality of spacers 204 are formed at the sidewalls of SiO—SiN blocks, as shown in FIG. 2B. The silicon substrate 100 is carved by dry etching process to form the trenches 210, and the interior surfaces of the trenches 210 are oxidized by thermal oxidation process to form the liner oxide layer 212, as shown in FIG. 2C.

Although the thicker liner oxide has a positive effect on the reliability of device, the thicker liner oxide layer has narrowed the width of trench so as to increase the high density plasma (HDP) oxide sidewall redeposition. That makes the high density plasma (HDP) oxide fill-in more difficult. After a high density plasma (HDP) oxide layer 214 is deposited, a void 216 is created in the trench 210, as shown in FIG. 2D.

Thus, there remains a need for trench-filling process that provides the void-free feature to ensure the insulating function of insulating material such as high density plasma (HDP) oxide.

SUMMARY OF THE INVENTION

It is therefore an object of the invention to provide a method of shallow trench isolation fill-in, so as to create the void-free trench after filled with the isolating material.

The invention achieves the above-identified objects by providing a method of shallow trench isolation fill-in, wherein a silicon substrate having a plurality of trenches is provided. First, a liner oxide layer is formed in the trenches. Next, the silicon substrate is pre-wetted with deionized (DI) water; and the liner oxide layer is etched by a chemical solution. The chemical solution is an oxide etchant, such as hydrofluoric acid (HF) solution or buffered oxide etchant (BOE). The etching rate close to an opening of a trench is faster than the etching rate close to a bottom of the trench. Finally, the trenches are filled with a high density plasma (HDP) oxide layer. According to the invention, the prewet-chemical treatment does widen the opening of the trench, so that no void is generated after the trench is filled with the high density plasma (HDP) oxide.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
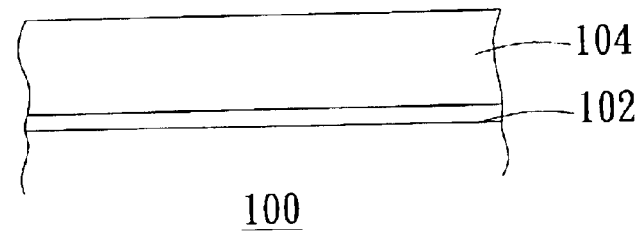
FIG. 1A~FIG. 1F (prior art) schematically illustrate a conventional trench formation and high density plasma (HDP) oxide fill-in process.
Figure 1B:
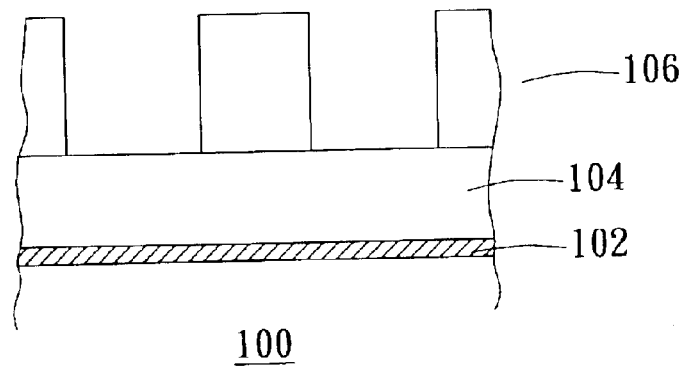
Figure 1C:
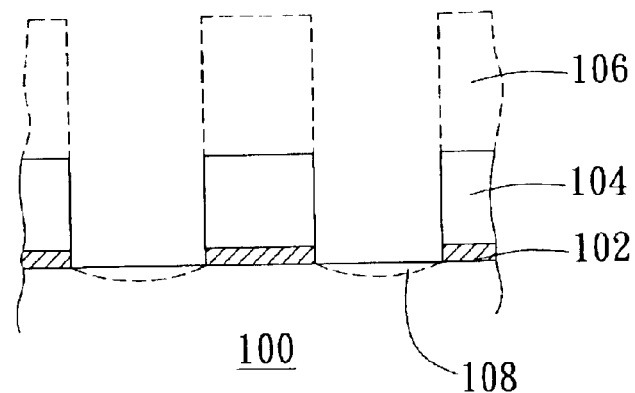
Figure 1D:
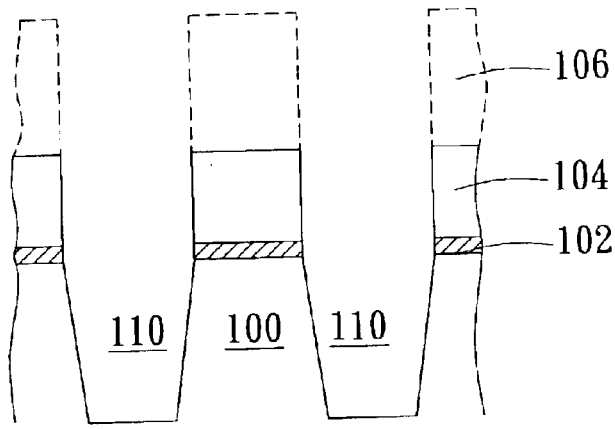
Figure 1E:
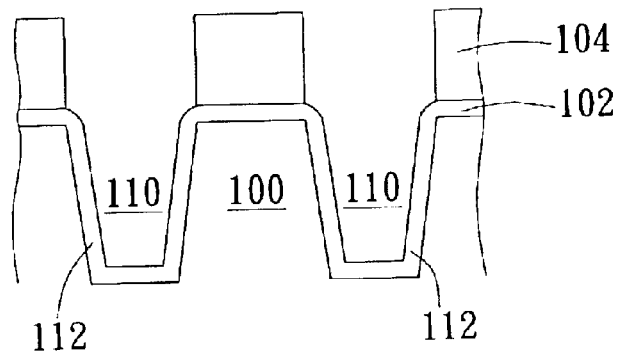
Figure 1F:
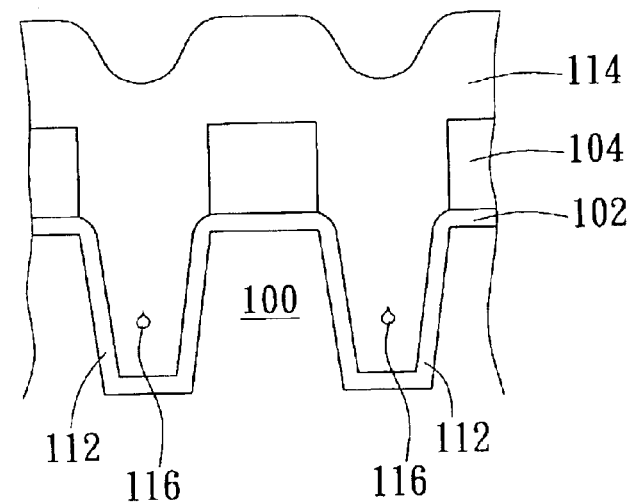
Figure 2A:
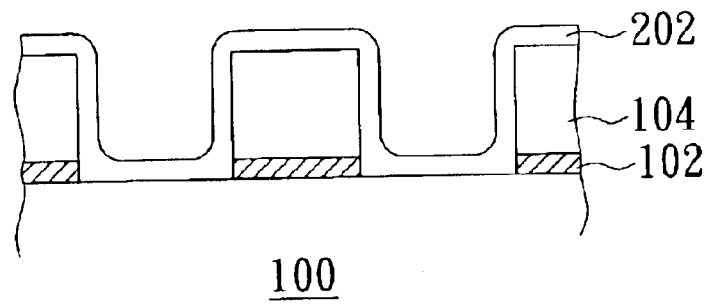
FIG. 2A~FIG. 2D (prior art) schematically illustrate another conventional trench formation and high density plasma (HDP) oxide fill-in process.
Figure 2B:
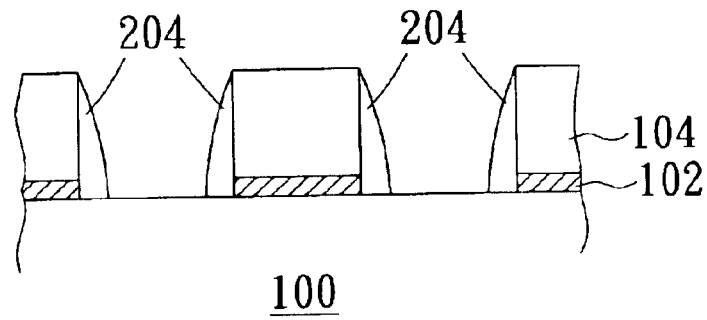
Figure 2C:
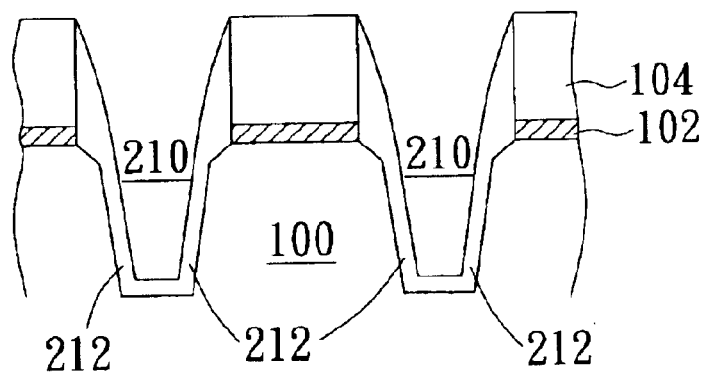
Figure 2D:
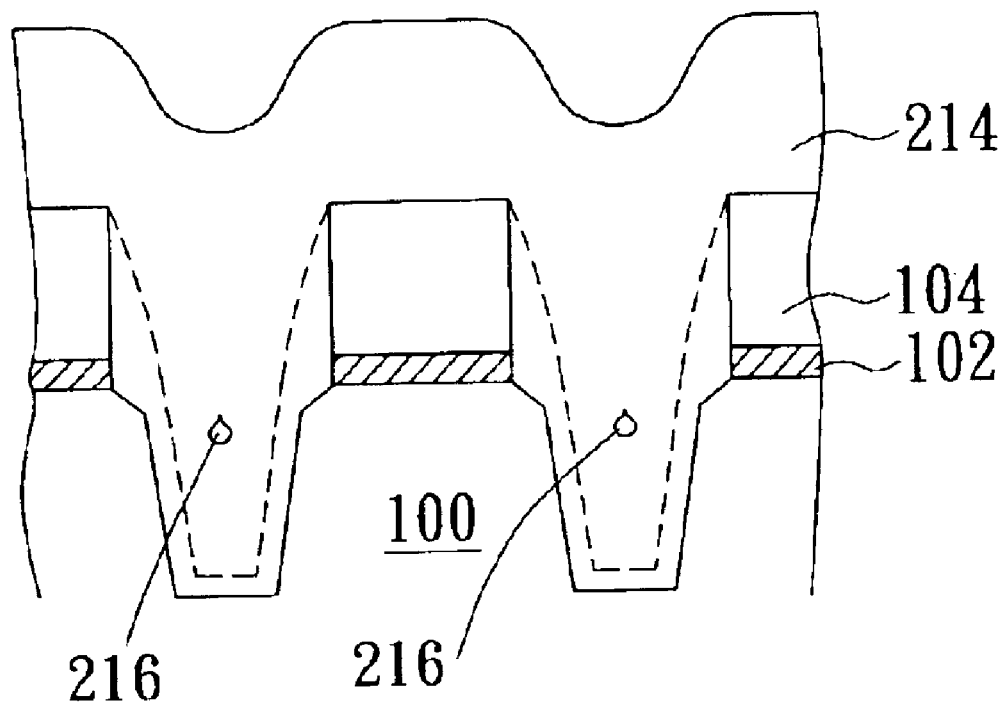

In the present invention, the opening of the trench is widened before the trench is completely filled with the insulating material such as high density plasma (HDP) oxide. In accordance with the embodiments of the invention, the pre-wetting process on the silicon substrate is provided, which allows the trenches to be filled without voids.

Additionally, the drawings used for illustrating the embodiment of the invention only show the major characteristic parts of the semiconductor device in order to avoid obscuring the invention. Accordingly, the specification and the drawing are to be regard as an illustrative sense rather than a restrictive sense.

Figure 3A:
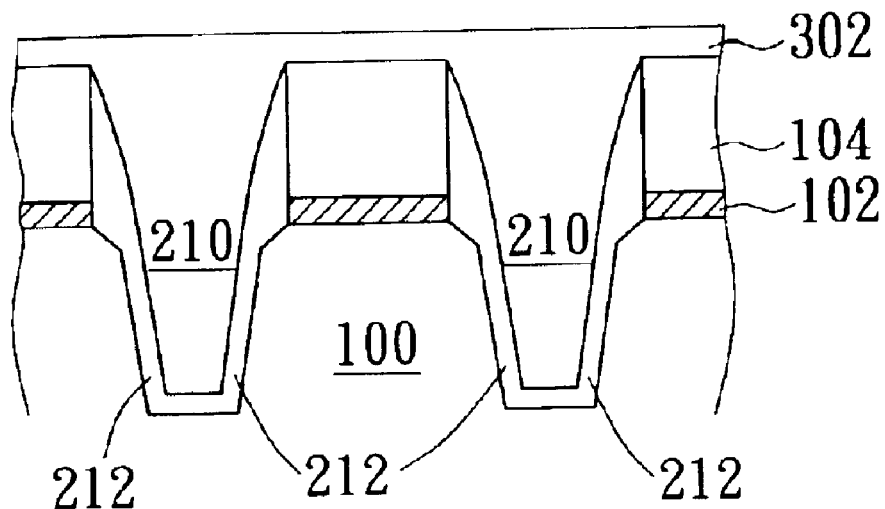
FIG. 3A~FIG. 3D schematically illustrate a method of shallow trench isolation fill-in according to the first embodiment of the invention.
Figure 3B:
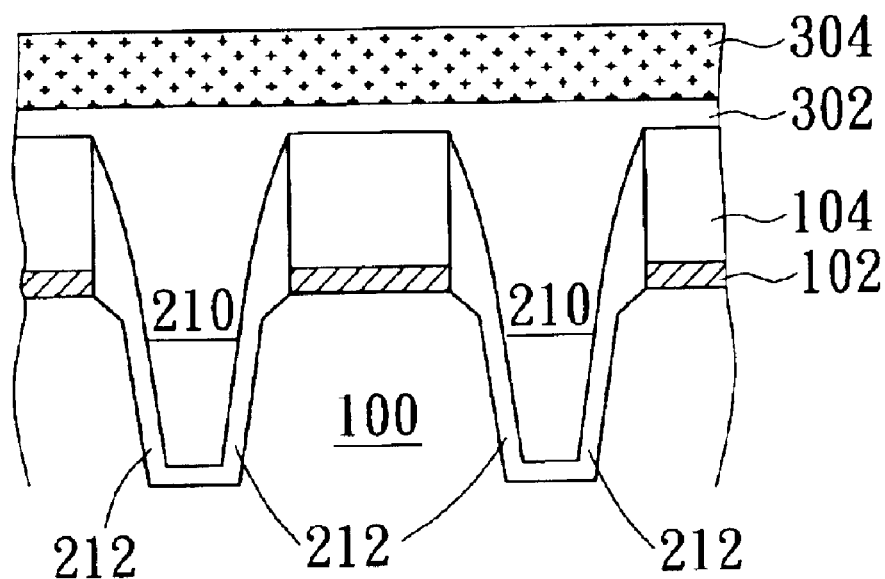

FIG. 3A~FIG. 3D schematically illustrate a method of shallow trench isolation fill-in according to the first embodiment of the invention. Before the step of FIG. 3A, steps similar to those of FIG. 1A~FIG. 1C, FIG. 2A~FIG. 2C are carried out. In the first embodiment of the invention, the silicon substrate 100 is pre-wetted by deionized (DI) water, to form a thin film of water 302, as shown in FIG. 3A. Then, a chemical solution is applied to the silicon substrate 100, so as to form a chemical film 304 over the water film 302, as shown in FIG. 3B. The chemical solution is anyone of oxide etchant, such as a hydrofluoric acid (HF) solution, or a buffered oxide etchant (BOE) solution. The chemical solution diffuses through the thin film of water to reach the surface to be etched, such as the surface of liner oxide 212.

Figure 4:
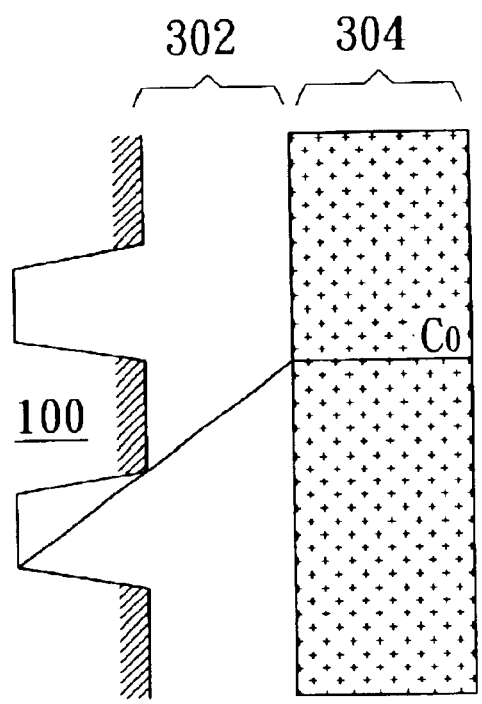
FIG. 4 is a chemical concentration profile in the water film of FIG. 3B.

Please refer to FIG. 4, a chemical concentration profile in the water film of FIG. 3B. The etching rate depends on the chemical concentration; therefore, the etching rate close to the opening of the trench 210 is faster than the etching rate close to the bottom of the trench. The etch rate of the liner oxide 212 close to the opening of the trench 210 is more quickly than the etching rate of the liner oxide 212 close to the bottom of the trench 210. The time of chemical film 304 contacting with the water film 302 varies depending on the initial concentration ($C_0$) of the chemical solution and how much liner oxide loss is required.

Figure 3C:
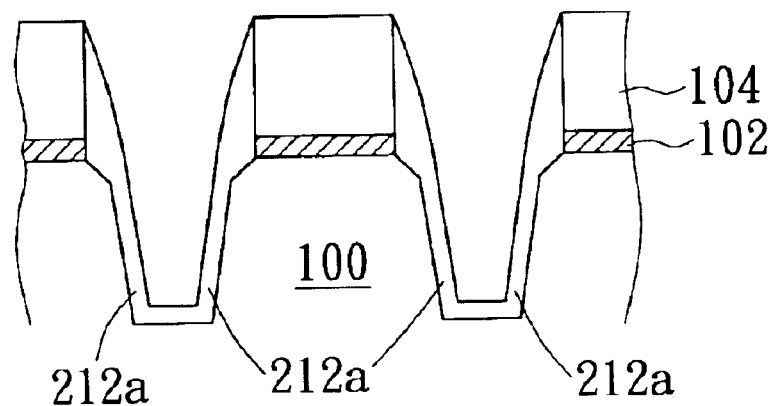
Figure 3D:
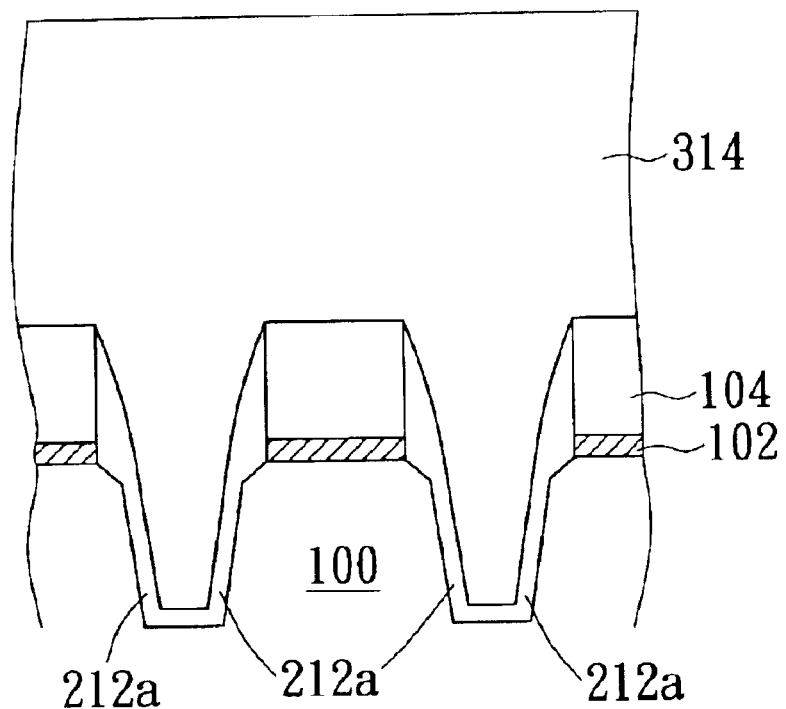

Then, the silicon substrate 100 is rinsed by DI water, and further purged by nitrogen ($N_2$) gas or $N_2$/Isopropyl alcohol (IPA) gas. It shows that the trench 210 has become wider after prewet-chemical treatment of the invention, and the profile of liner oxide 212a is shown in FIG. 3C. Consequently, the trench 210 with wider opening can be filled with the high density plasma (HDP) oxide layer 314 without the occurrence of void, as shown in FIG. 3D.

In the preferred embodiment, a single-wafer spinning tool can be used for carrying out the prewet-chemical treatment of the invention, and the procedure is described below. First, the silicon substrate 100 is rotated and maintained at a certain speed by the single-wafer spinning tool. An injection nozzle is installed above the substrate 100. Then, deionized (DI) water is injected to the silicon substrate 100 while the silicon substrate 100 is spinning. Next, stop injecting deionized (DI) water after the water film is formed over the silicon substrate 100. Then, a chemical solution (an oxide etchant) is injected to the silicon substrate 100 to form a chemical film over the silicon substrate 100; meanwhile, the silicon substrate 100 is spinning. Then, stop injection of oxide etchant, and speed up the rotation of substrate for throwing the chemicals away. Finally, the substrate is rinsed by DI water, and purged by $N_2$ gas or $N_2$/Isopropyl alcohol (IPA) gas.

Additionally, the high density plasma (HDP) oxide fill-in process of the invention can be conducted by a two-step deposition method. FIG. 5A~FIG. 5E schematically illustrate a method of shallow trench isolation fill-in according to the second embodiment of the invention. Before the step of FIG. 5A, steps similar to those of FIG. 1A~FIG. 1C, FIG. 2A~FIG. 2C are carried out.

Figure 5A:
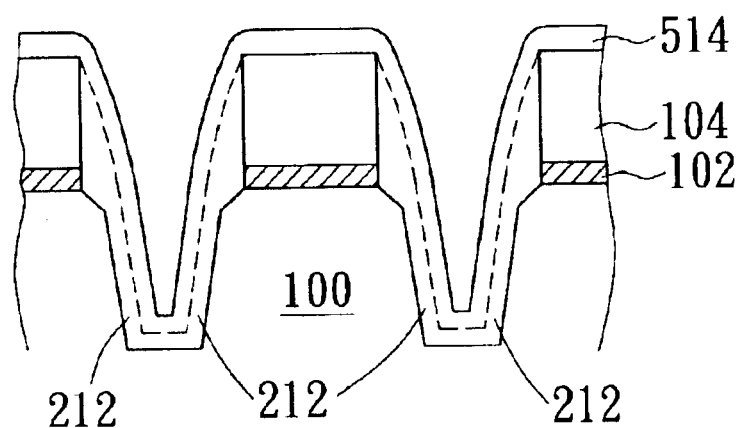
FIG. 5A~FIG. 5E schematically illustrate a method of shallow trench isolation fill-in according to the second embodiment of the invention.
Figure 5B:
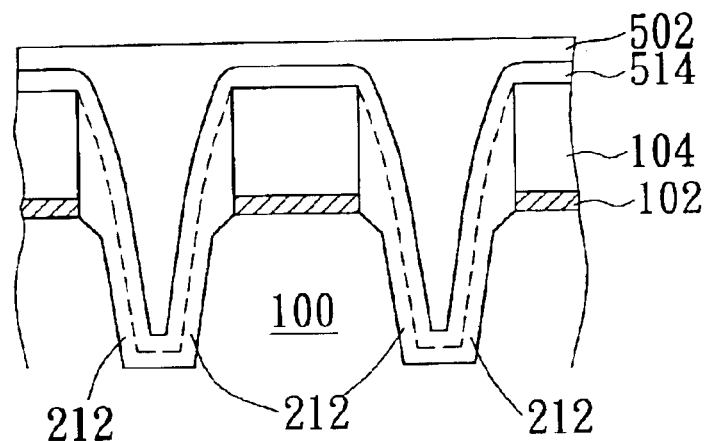

In the second embodiment of the invention, a first high density plasma (HDP) oxide layer 514 is filled in the trenches 210 by deposition, as shown in FIG. 5A. Then, the prewet-chemical treatment, similar steps described in the first embodiment, is conducted to widen the opening of the trench. The silicon substrate 100 is pre-wetted by deionized (DI) water, to form a thin film of water 502, as shown in FIG. 5B.

Figure 5C:
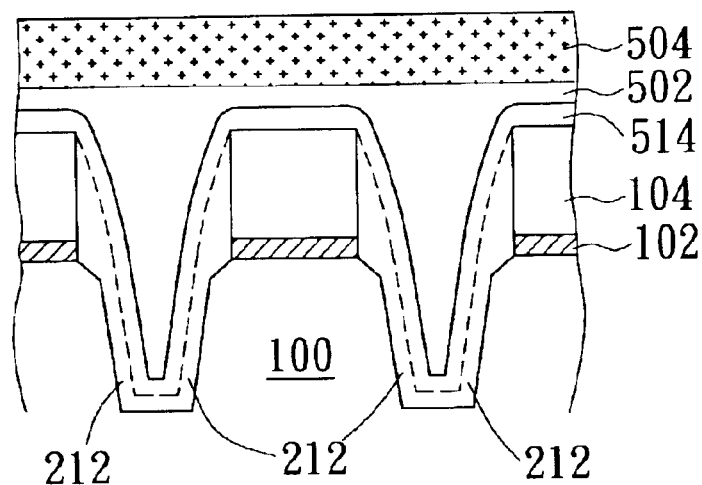

Next, a chemical solution, which is an oxide etchant such as hydrofluoric acid (HF) or buffered oxide etchant (BOE) solution, is applied to the silicon substrate 100, to form a chemical film 504 over the water film 502, as shown in FIG. 5C. The chemical solution diffuses through the water film 502 to reach the surface to be etched.

Figure 5D:
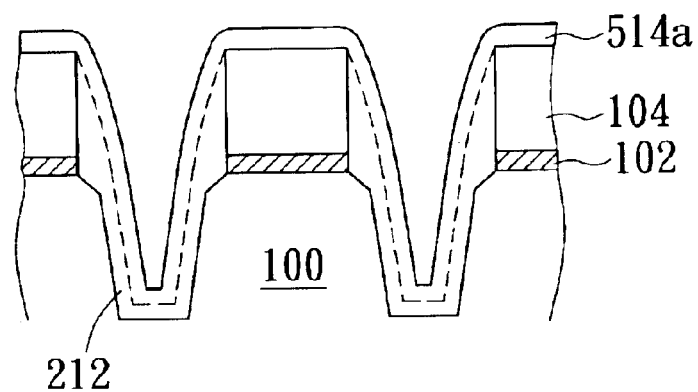
Figure 5E:
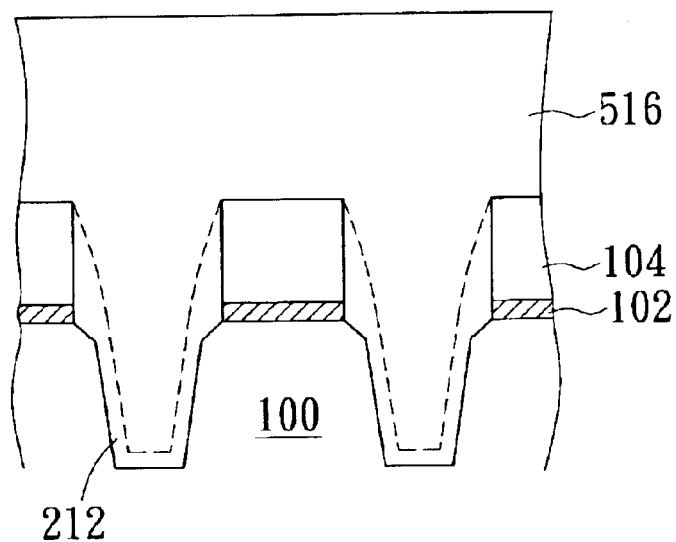

Then, the silicon substrate 100 is rinsed by deionized (DI) water, and further purged by nitrogen ($N_2$) gas or $N_2$/Isopropyl alcohol (IPA) gas. The profile of the liner oxide 514a depicted in FIG. 5D shows that the opening has become wider. A second high density plasma (HDP) oxide layer 516 is filled in by deposition afterward, as shown in FIG. 5E.

The second embodiment of the invention not only resolves the void issue but also possesses the advantage of liner oxide protection. Typical high density plasma (HDP) deposition process employs chemical vapor deposition (CVD) with a gas mixture containing oxygen ($O_2$), silane and argon, and etching and high density plasma (HDP) deposition are simultaneously achieved. The first high density plasma (HDP) oxide layer 514 protects the liner oxide layer 212 from being etched by the chemical solution (chemical film 504), and also from being struck by the gas ions during the second high density plasma (HDP) oxide layer deposition.

According to the aforementioned description, pre-wetting the substrate followed by chemical etching is useful for shallow trench isolation application, and particularly useful for isolation of trench with high aspect ratio.

The features of the present invention are further illustrated but not limited by the following experimental example.

EXAMPLE

Process of trench formation and the first high density plasma (HDP) oxide fill-in are carried out by the steps similar to those of FIG. 1A~FIG. 1C, FIG. 2A~FIG. 2C and FIG. 5A. Then, the prewet-chemical treatment of the invention is performed by using a single-wafer spinning tool. The buffered oxide etchant (BOE) solution is used as an oxide etchant herein. Also, a comparative experiment, which is performed without pre-wet step, is conducted in comparison First, the silicon substrate is rotated and maintained at a certain speed. Then, deionized (DI) water is injected to the silicon substrate for about 5~20 seconds, to form water film over the silicon substrate. Then, 10:1 buffered oxide etchant (BOE) solution is injected to the silicon substrate for about 4 seconds, to form a buffered oxide etchant (BOE) film over the silicon substrate; meanwhile, the silicon substrate is spinning. Then, speed up the rotation of substrate for throwing the buffered oxide etchant (BOE) solution away. Finally, the substrate is rinsed by deionized (DI) water, and purged by $N_2$ gas or $N_2$/Isopropyl alcohol (IPA) gas.

Figure 6:
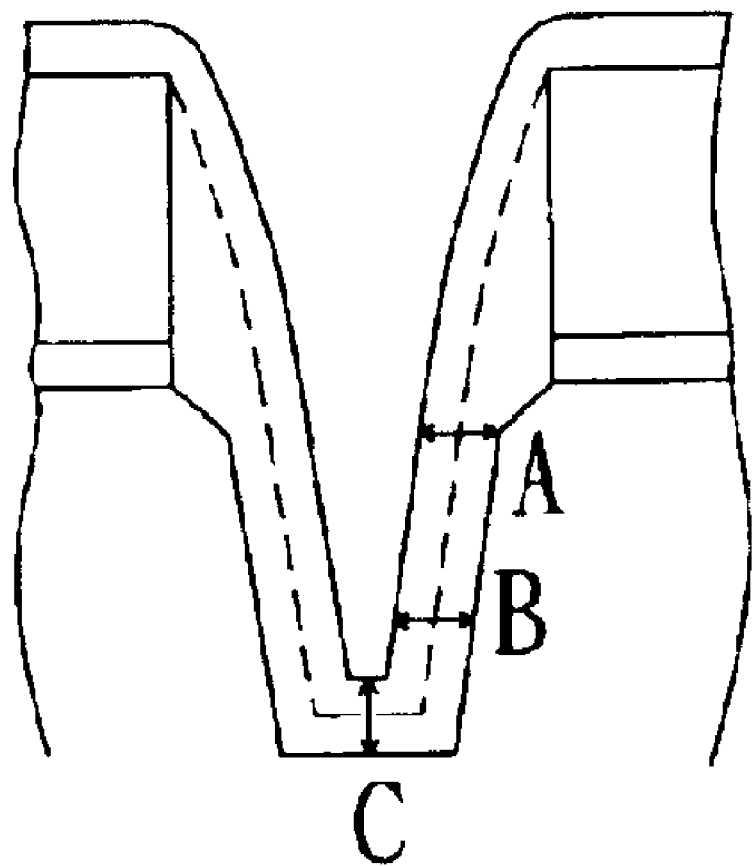
FIG. 6 shows the film thickness of the oxide layer in the trench to be measured according to the example of the invention.

The film thicknesses of the oxide layer in the trench are checked by a scanning electrical microscope (SEM), and the results are listed in Table 1. FIG. 6 shows the film thicknesses of the oxide layer in the trench to be measured in this example. Of which, the oxide layer includes the liner oxide layer and the first high density plasma (HDP) oxide layer deposition. "A" represents the thickness of oxide remained at the opening of the trench. "B" represents the thickness of oxide remained at the bottom of the trench. "C" represents the vertical height of oxide remained at the bottom of the trench.

TABLE 1

|   | 10:1 BOE without pre-wet step (Comparison) | 10:1 BOE with pre-wet step |
|---|---|---|
| A | 656.25 | 750 |
| B | 656.25 | 796.88 |
| C | 1312.5 | 1500 |
| B/A | 1 | 1.06 |
| C/A | 2 | 2 |

The results indicate that the value of B/A is increased while the pre-wetting procedure is conducted; in other words, the etching rate close to the opening of the trench is faster than the etching rate close to the bottom of the trench. Accordingly, the prewet-chemical treatment of the invention does widen the opening of the trench. Also, no void is observed after the trench is filled with the high density plasma (HDP) oxide.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of shallow trench isolation fill-in, wherein a silicon substrate having a plurality of trenches is provided, the method comprising the steps of:

forming a liner oxide layer in the trenches;

pre-wetting the silicon substrate with deionized (DI) water;

partially etching the liner oxide layer by a chemical solution, which the chemical solution is an oxide etchant, wherein the etching rate close to an opening of a trench is faster than the etching rate close to a bottom of the trench; and filling the trenches with a high density plasma (HDP) oxide layer.

2. The method of shallow trench isolation fill-in according to claim 1, wherein deionized (DI) water is injected to the silicon substrate while it is spinning.

3. The method of shallow trench isolation fill-in according to claim 1, wherein the chemical solution is injected to the silicon substrate while it is spinning.

4. The method of shallow trench isolation fill-in according to claim 1, wherein the chemical solution is hydrofluoric acid (HF) solution.

5. The method of shallow trench isolation fill-in according to claim 1, wherein the chemical solution is a buffered oxide etchant (BOE) solution.

6. The method of shallow trench isolation fill-in according to claim 1, wherein the silicon substrate is rinsed by deionized (DI) water after the step of chemically etching the liner oxide layer.

7. The method of shallow trench isolation fill-in according to claim 6, wherein the silicon substrate is further purged by nitrogen gas after rinsed by deionized (DI) water.

8. The method of shallow trench isolation fill-in according to claim 6, wherein the silicon substrate is further purged by nitrogen gas and isopropyl alcohol (IPA) vapor after rinsed by deionized (DI) water.

9. A method of shallow trench isolation fill-in, wherein a silicon substrate having a plurality of trenches is provided, the method comprising the steps of:

forming a liner oxide layer in the trenches;

filling the trenches with a first high density plasma (HDP) oxide layer;

pre-wetting the silicon substrate with deionized (DI) water;

etching the first high density plasma (HDP) oxide layer by a chemical solution, which the chemical solution is an oxide etchant; and filling the trenches with a second high density plasma (HDP) oxide layer.

10. The method of shallow trench isolation fill-in according to claim 9, wherein deionized (DI) water is injected to the silicon substrate while it is spinning.

11. The method of shallow trench isolation fill-in according to claim 9, wherein the chemical solution is injected to the silicon substrate while it is spinning.

12. The method of shallow trench isolation fill-in according to claim 9, wherein the chemical solution is a hydrofluoric acid (HF) solution.

13. The method of shallow trench isolation fill-in according to claim 9, wherein the chemical solution is a buffered oxide etchant (BOE) solution.

14. The method of shallow trench isolation fill-in according to claim 9, wherein the silicon substrate is rinsed by deionized (DI) water after the step of chemically etching the first high density plasma (HDP) oxide layer.

15. The method of shallow trench isolation fill-in according to claim 14, wherein the silicon substrate is further purged by nitrogen gas after rinsed by deionized (DI) water.

16. The method of shallow trench isolation fill-in according to claim 15, wherein the silicon substrate is further purged by nitrogen gas and isopropyl alcohol (IPA) vapor after rinsed by deionized (DI) water.

17. The method of shallow trench isolation fill-in according to claim 9, wherein the etching rate close to an opening of a trench is faster than the etching rate close to a bottom of the trench.

* * * * *